United States Patent [19]

Amano

[11] Patent Number: 4,768,015
[45] Date of Patent: Aug. 30, 1988

[54] A/D CONVERTER FOR VIDEO SIGNAL

[75] Inventor: Tatsuyuki Amano, Tokyo, Japan

[73] Assignee: NEC Corporation, Tokyo, Japan

[21] Appl. No.: 93,834

[22] Filed: Sep. 8, 1987

[30] Foreign Application Priority Data

Sep. 5, 1986 [JP] Japan .................................. 61-210226

[51] Int. Cl.$^4$ ............................................. H03M 1/36
[52] U.S. Cl. .................................. 340/347 AD; 358/13
[58] Field of Search .................. 340/347 AD; 358/13, 358/31

[56] References Cited

U.S. PATENT DOCUMENTS

| | | | |
|---|---|---|---|
| 3,298,014 | 10/1967 | Stephenson | 340/347 AD |
| 3,585,631 | 6/1971 | McCown | 340/347 AD |
| 3,646,548 | 2/1972 | Van Doren | 340/347 AD |
| 4,008,468 | 2/1977 | Imhoff | 340/347 AD |

*Primary Examiner*—Charles D. Miller
*Attorney, Agent, or Firm*—Sughrue, Mion, Zinn, Macpeak & Seas

[57] ABSTRACT

An A/D converter comprises a first reference voltage source generating a first group of reference voltages distributed in a first voltage range, and a first A/D converting circuit connected to receive an analog signal and the first group of reference voltages for generating a first digital signal. The A/D converter also includes a second reference voltage source having a bias input receiving a bias voltage and generating a second group of reference voltages which are distributed in a second voltage range smaller than the first voltage range and which are biased by a bias voltage inputted to the bias input, and a second A/D converting circuit connected to receive the analog signal mentioned above and the second group of reference voltages for generating a second digital signal. A calculator is provided to receive the first and second digital signals for generating a third digital signal having a resolution higher than that of the first digital signal. A bias voltage generator receives the third digital signal for generating an analog bias voltage to the bias input of the second reference voltage source.

20 Claims, 3 Drawing Sheets

A/D CONVERTER FOR VIDEO SIGNAL

BACKGROUND OF THE INVENTION

1. Field of the Invention

The present invention relates to a video signal processing device, and more particularly, to an analog-to-digital converter for converting an analog video signal to a digital video signal having a high resolution.

2. Description of Related Art

Generally, in television and in video recording, picture information is processed using analog signal, and also is recorded and reproduced in the form of an analog signal. But, in order to carry out a high degree of picture information processing for improvement of picture quality such as noise suppression and interpolation using interline or interframe correlation, and in order to realize special effects of picture such as scale reduction and movement, a digital signal is preferred. Therefore, a video signal has been often converted to a digital signal and treated in a digital signal processing manner in broadcasting installations and industrial equipments.

This inclination also appears and is now increasing in private products. Particularly, since integrated circuit devices such an analog-to-digital converter (called "A/D converter" hereinafter), a digital-to-analog converter (called "D/A converter" hereinafter), a large capacity memory, and a high speed processor have greatly advanced and become inexpensive, the digital processing of picture information attracts a good deal of attention, and some apparatus for private use, using a video information digital processing, have already become available.

Briefly, a conventional apparatus for processing a video signal in a digital manner comprises an A/D converter receiving an analog video signal for generating a digital video signal, a digital processor receiving the digital video signal from the A/D converter for performing a required processing to the digital video signal, and a D/A converter receiving a modified digital video signal from the digital processor for generating a modified analog video signal.

In the above mentioned video information digital processing device, the A/D converter is required to convert an input video signal at a conversion rate of 20,000,000 samples per second or more in view of the nature of picture itself. Therefore, a so-called flash type of A/D converter is generally used. Assuming that the A/D converter is adapted to a parallel digital signal of n bits (n is an integer larger than 1), the A/D converter ordinarily includes $2^n$ two-input comparators. One inputs of all the comparators are commonly connected to receive an input analog video signal, and the other inputs of the comparator are connected to $2^n$ different reference voltages, respectively. Outputs of all the comparators are inputted to an encoder, which generates a digital signal of n bits on the basis of the results of the parallel comparison between the voltage of the input video signal and the $2^n$ reference voltages.

As seen from the above, the high speed A/D converter which can output a digital signal of n bits needs $2^n$ comparators and $2^n$ different reference voltage sources. In other words, in order to obtain a required resolution, comparators and reference voltage sources of the large number corresponding to the resolution are needed. This means that the higher the required resolution becomes, the larger the required chip area for the A/D converter becomes. For example, to elevate the resolution one bit, the chip area required for the A/D converter must be doubled.

On the other hand, it is a matter of course that if the resolution is decreased, the quality of the picture will be inevitably deteriorated. Even in the case of private products, seven or eight bits of resolution are required, except for a very small picture size. In particular, a high resolution is required in a picture in which a luminance gradually and smoothly changes. In this case, if the resolution of the digital signal is low, the luminance will remarkably change at a point where the value of the digital video signal changes. This is wellknown as "false contour", and will give a nonnatural feeling to a viewer.

Furthermore, if the resolution of the digital signal is increased in a video information digital processing device, not only the A/D converter but also the digital signal processor will be enlarged in size. However, the enlargement of the digital signal processor caused by the increase of resolution is not so large, and is rather very small as compared with the increase of the A/D converter. For example, if the resolution is increased from seven bits to eight bits, the required A/D converter will be doubled in size, but the signal processor will be increased at the degree of 8/7 to $(8/7)^2$. Specifically, a circuit for multiplication is increased by $(8/7)^2$.

As can be understood from the above explanation, in order to elevate the resolution in the conventional video information digital processing apparatus, the A/D converter has to be greatly increased in size.

SUMMARY OF THE INVENTION

Accordingly, it is an object of the present invention to provide an A/D converter which can have an increased resolution with increase of circuits less than that in the conventional A/D converter.

Another object of the present invention is to provide an A/D converter which can output a digital signal of n bits without requiring $2^n$ comparators.

Still another object of the present invention is to provide an A/D converter which can be installed in a video signal processing integrated circuit and which can increase the resolution of the video signal processing apparatus without a large increase of the chip area.

The above and other objects of the present invention are achieved in accordance with the present invention by an A/D converter comprising a first reference voltage source generating a first group of reference voltages distributed in a first voltage range, a first A/D converting circuit connected to receive an analog signal and the first group of reference voltages for generating a first digital signal, a second reference voltage source having a bias input receiving a bias voltage and generating a second group of reference voltages which are distributed in a second voltage range smaller than the first voltage range and which are biased by a bias voltage inputted to the bias input, a second A/D converting circuit connected to receive the analog signal mentioned above and the second group of reference voltages for generating a second digital signal, a calculator receiving the first and second digital signals for generating a third digital signal having a resolution higher than that of the first digital signal, and a bias voltage generator receiving the third digital signal for generating an analog bias voltage to the bias input of the second reference voltage source.

In one embodiment of the A/D converter, the calculator includes a shifter receiving the first digital signal for outputting a digital signal shifted by a predetermined bit number, and an adder receiving the shifted digital signal and the second digital signal for generating the third digital signal having the bit number larger than that of the first digital signal by the above mentioned predetermined bit number.

In another embodiment of the A/D converter, the calculator includes a shifter receiving the first digital signal for outputting a digital signal shifted by a predetermined bit number, a memory storing correction data for compensating conversion distortion and connected to receive the first digital signal so as to output a correction digital signal in accordance with the first digital signal, a first adder receiving the correction digital signal and the second digital signal for generating the corrected second digital signal, and a second adder receiving the shifted digital signal and the corrected second digital signal for generating the third digital signal having the bit number larger than that of the first digital signal by the above mentioned predetermined bit number.

Furthermore, the bias voltage generator can include a delay circuit receiving the third digital signal for generating a delayed third digital signal and a D/A converter receiving the delayed third digital signal for generating the analog bias voltage.

Specifically, the delay circuit includes a delay line receiving the third digital signal for generating a delayed third digital signal and a rounding circuit receiving the delayed third digital signal for generating a rounded third digital signal to the D/A converting circuit. Alternatively, the delay includes a delay line receiving the third digital signal for generating a delayed luminance signal and a delayed chroma signal, and a calculator receiving the delayed luminance signal and the delayed chroma signal for generating a modified third digital signal to the D/A converting circuit. Further, the delay circuit can include a frame memory receiving the third digital signal for generating a digital signal of a video information before one frame but at the same picture element position as that of the video signal inputted.

In a preferred embodiment, the second reference voltage source includes two fixed voltage sources having the same output voltage and series-connected in the same polarity to each other, and a plurality of series-connected resistors of the same resistance connected across the series-connected voltage sources so that all connection nodes of the series resistors generate the second group of different reference voltages, respectively, the connection node between the two fixed voltage sources being connected to receive the bias voltage.

In another preferred embodiment, the first reference voltage source includes a first constant current source supplying a first constant current and first series resistors of the same resistance connected in series to the first constant current source so that the respective connection nodes of the first resistors will generate that first group of different voltages distributed at equal voltage difference in the first voltage range, and the second reference voltage source includes a second constant current source supplying a second constant current smaller than the first constant current and second series resistors having the same resistance smaller than the first resistors and connected in series to the second constant current source so that the respective connection nodes of the second resistors will generate that second group of different voltages distributed at equal voltage difference in the second voltage range.

The above and other objects, features and advantages of the present invention will be apparent from the following description of preferred embodiments of the invention with reference to the accompanying drawings.

DESCRIPTION OF THE PREFERRED EMBODIMENTS

Figure 1:
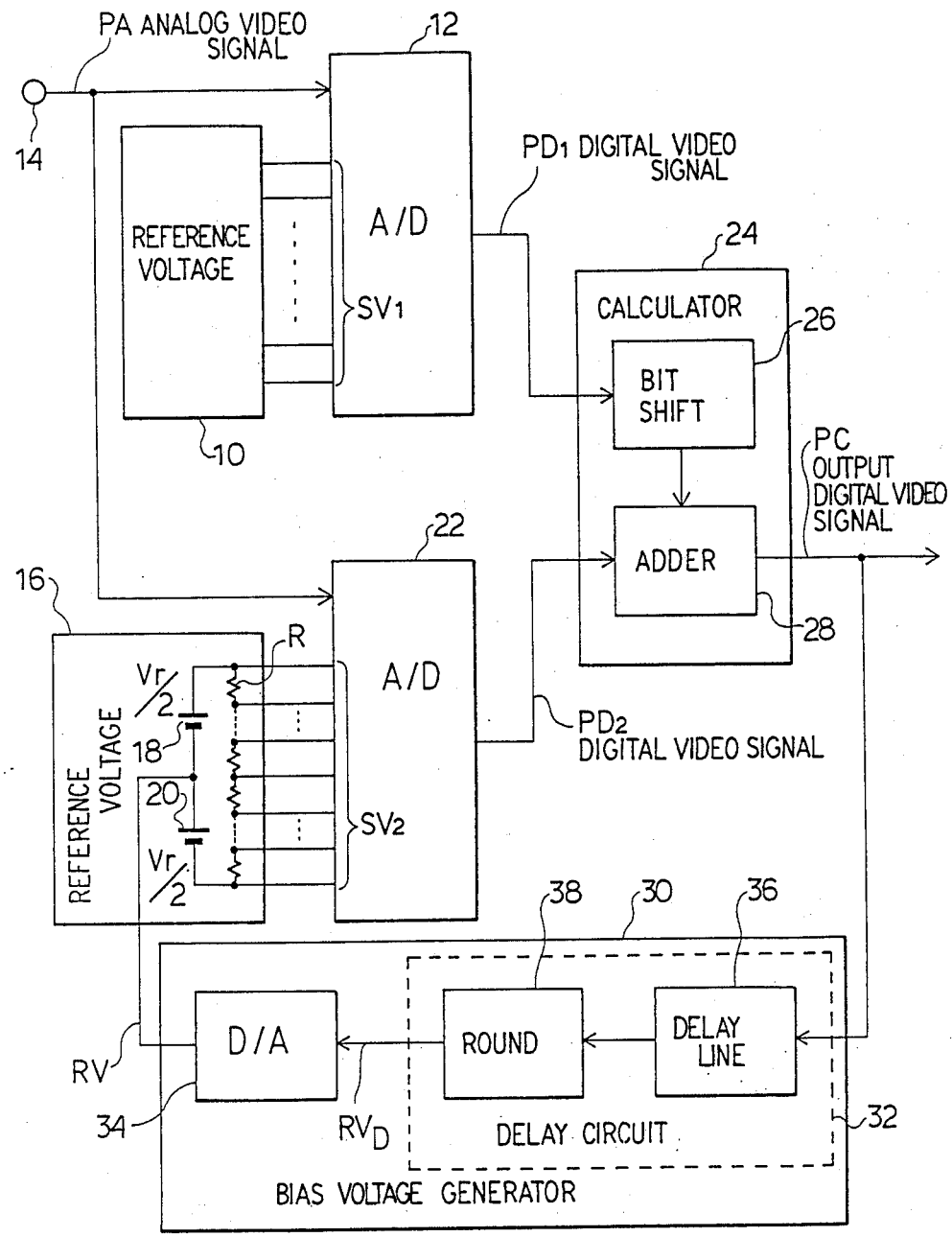
FIG. 1 is a block diagram of an embodiment of the A/D converter in accordance with the present invention.

Referring to FIG. 1, the shown embodiment of the A/D converter in accordance with the present invention comprises a first reference voltage source 10 adapted to generate $2^6$ different reference voltages distributed at equal voltage differences in a first predetermined voltage range $SV_1$. The $2^6$ reference voltages are supplied to a first A/D converting circuit 12, which in turn receives an analog video signal PA through an input terminal 14 and is adapted to generate a first digital video signal $PD_1$ of 6 bits. Upper and lower limits of the first voltage range $SV_1$ correspond to maximum and minimum voltages of the input video signal PA.

The A/D converter also includes a second reference voltage source 16 generating $2^6$ different reference voltages distributed at equal voltage differences in a second predetermined voltage range $SV_2$ smaller than the voltage range $SV_1$. Therefore, the voltage difference between each pair of adjacent voltages of the $2^6$ reference voltages generated by the second voltage source 16 is smaller than that between each pair of adjacent voltages of the $2^6$ reference voltages generated by the first voltage source 10. In this embodiment, $SV_2$ is one-eighth ($\frac{1}{8}^3$) of $SV_1$. This second voltage source 16 has a bias input receiving a bias voltage RV so that all the $2^6$ reference voltages are biased by the bias voltage RV.

For example, the second voltage source 16 includes two fixed voltage sources 18 and 20 having the same output voltage $Vr/2$ (where $Vr = SV_2$) and series-connected in the same polarity to each other. Across the series-connected voltage sources 18 and 20 there are connected $(2^6-1)$ series-connected resistors R of the same resistance, so that all connection nodes of the series resistors R generate the $2^6$ different reference voltages, respectively. On the other hand, the connection node between the two fixed voltage sources 18 and 20 is connected to receive the bias voltage RV. Thus, a voltage of $RV + Vr/2$ can obtained from a positive terminal of the voltage source 18, and a voltage of $RV - Vr/2$ can obtained from a negative terminal of the voltage source 20. The $2^6$ different reference voltages distributed in the range of $(RV-Vr/2)$ to $(RV+Vr/2)$ can be obtained from the respective connection nodes of the series-connected resistors R.

The $2^6$ different reference voltages generated by the second voltage source 16 are supplied to a second A/D converting circuit 22, which also receives the analog video signal PA through the input terminal 14. This second A/D converting circuit 22 generates a second digital video signal $PD_2$ of 6 bits. Specifically, when the voltage of the input video signal PA is equal to the bias voltage RV, the circuit 22 generates the second digital signal $PD_2$ indicative of 0. When the input video signal PA is smaller than the bias voltage RV, the second digital signal indicates the voltage difference in the form of two's complement. On the other hand, the input video signal PA is larger than the bias voltage RV, the second digital signal indicates the voltage difference in a normal form.

The first and second digital signals $PD_1$ and $PD_2$ are inputted to a calculator 24 for generating a third or output digital video signal PC of 9 bits. Specifically, the calculator 24 has a bit shifter 26 receiving the first digital signal $PD_1$, and generating a digital signal obtained by upwardly shifting the digital signal $PD_1$ by 3 bits. In other words, assuming that the first digital signal $PD_1$ is reprsentative of a digital value of X, the bit shifter 26 generates a digital signal of 9 bits which indicates a digital value of $2^3 \cdot X$. This shifted digital signal of 9 bits is inputted to a first input of an adder 28, which receives at its second input the second digital signal $PD_2$. Thus, the adder 28 generates the third digital signal PC of 9 bits, which is supplied to a video signal processing circuit (not shown) and a bias voltage generator 30. Therefore, assuming that the first and second digital signals $PD_1$ and $PD_2$ represents the digital values X and Y, respectively, the calculator 24 will generates the third digital signal PC representative of the digital value $2^3 \cdot X + Y$.

The bias voltage generator 30 includes a delay circuit 32 receiving the digital signal PC, and a D/A converting circuit 34 connected to an output of the delay circuit 32 for generating the above mentioned bias voltage RV. The delay circuits 32 is provided to make it possible to use, as the bias voltage, a voltage of the video signal for a picture element vertically adjacent to the picture element represented by the analog video signal PA inputted to the input terminal 14. Therefore, assuming that the input analog video signal PA is a signal of the NTSC color television system, the delay circuit 32 includes a delay line 36 giving a delay time corresponding to two horizontal scan periods. The delay line 36 outputs the delayed digital signal or digital bias signal $RV_D$ to a rounding circuit 38, which in turn rounds off the 9-bit digital signal to a 6-bit digital signal. Thus, the D/A converting circuit 34 converts the 6-bit digital signal to an analog voltage to be used as the bias voltage.

Now, operation will be explained on the A/D converter shown in FIG. 1.

An analog video signal PA is inputted through the terminal 14 to the two A/D converting circuits 12 and 22. On the other hand, as mentioned above, the bias input of the second reference voltage source 16 ceaselessly receives, from the bias voltage generator 30, the bias voltage RV equal to the voltage of the video signal before two horizontal scan periods from the analog video signal PA inputted to the input terminal 14.

Thus, the A/D converting circuit 12 generates the first digital signal $PD_1$ of 6 bits which has the resolution obtained by dividing the voltage range $SV_1$ by $2^6$, and the A/D converting circuit 22 generates the second digital signal $PD_2$ of 6 bits which has the resolution obtained by dividing the voltage range $SV_2$ by $2^6$. As mentioned above, since the $SV_2$ is $\frac{1}{2^3}$ or $\frac{1}{8}$ of $SV_1$, the second digital signal $PD_2$ has the precision eight times of the first digital signal $PD_1$.

Figure 2:
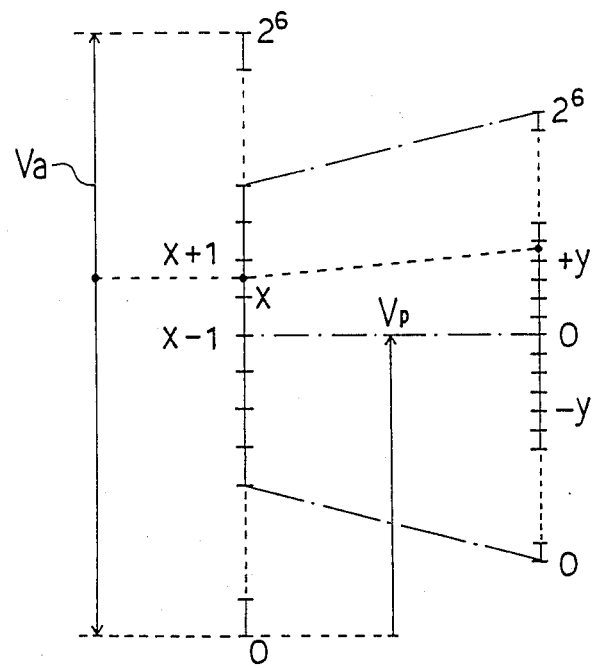
FIG. 2 illustrates the input to output relation of two A/D converting circuits provided in the A/D converter shown in FIG. 1.

Now, assuming that the voltages of the input analog video signal PA and the bias voltge RV are represented by $V_a$ and $V_p$, respectively, as shown in FIG. 2, the range $SV_2$ of the second reference voltage source 16 is $V_p \pm V_r/2$, and therefore, if $V_a = V_p$, the second A/D converting circuit 22 generates the digital signal $PD_2$ representative of 0. In this case, the calculator 24 outputs the third digital signal PC obtained by shifting only the first digital signal $PD_1$ by three bits. Namely, if the first digital signal $PD_1$ represents the digital value X, the calculator 24 will generates the third digital signal PC representative of the digital value $2^3 \cdot X$. If $V_a$ is not less than $V_p - V_r/2$ and not larger than $V_p + V_r/2$, the second A/D converting circuit 22 generates the digital signal $PD_2$ representative of a deviation of the voltage of the input video signal PA from the bias voltage $V_p$, and therefore, the calculator 24 generates the third digital signal PC indicative of the value $2^3 \cdot X + Y$, assuming that the second digital signal $PD_2$ represents the digital value Y.

Thus, the third digital signal PC will have the resolution eight times of the first digital signal $PD_1$ if the input video signal PA does not greatly change from the voltage of the video signal before the two horizontal scan periods. Namely, the A/D conversion having the 9-bit resolution can be carried out by using two A/D converting circuits having a 6-bit resolution. However, if $V_a$ is less than $V_p - V_r/2$ or larger than $V_p + V_r/2$, only the first A/D converting circuit 12 can function for the A/D conversion, and therefore, the resolution becomes 6 bits. But, this is not a significant problem, because the tone of the picture element greatly changes in such a case, and so, the naked eyes of a human being cannot discriminate the decrease of the resolution.

Figure 3:
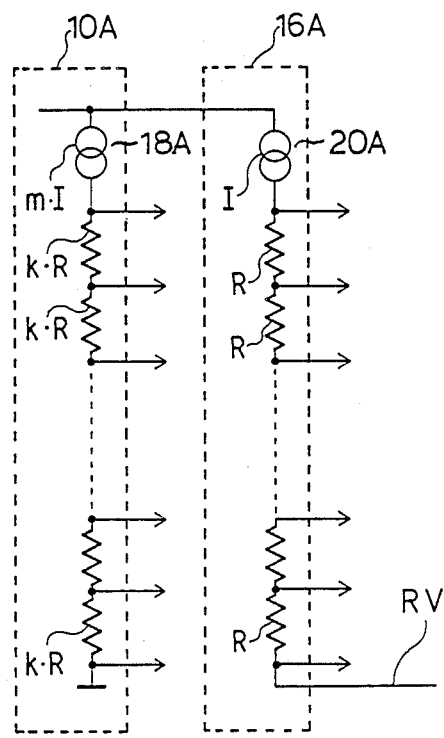
FIG. 3 is a circuit diagram showing another embodiment of the reference voltage sources provided in the A/D converter shown in FIG. 1.

Turning to FIG. 3, there is shown a modification of the reference voltage sources 10 and 16. A first circuit 10A includes a constant current source 18A supplying a constant current of m·I and $(2^6-1)$ series resistors connected in series to the constant current source 18A and having the same resistance of k·R. Accordingly, the respective connection nodes of the resistors will generate $2^6$ different voltages distributed at equal voltage difference $(m \cdot I \times k \cdot R)$ in a voltage range of $(2^6-1) \times (m \cdot I \times k \cdot I)$. On the other hand, a second circuit 16A includes a constant current source 20A supplying a constant current of I and $(2^6-1)$ series resistors connected in series to the constant current source 20A and having the same resistance of R. Accordingly, the respective connection nodes of the resistors will generate $2^6$ different voltages distributed at equal voltage difference $(I \times R)$ in a voltage range of $(2^6-1) \times (I \times R)$. Therefore, if the coefficient "k·m" is set at $2^3$, the first and second circuits 18A and 20A can be used as the first and second reference voltage sources 10 and 16, respectively. From another view point, it can be said that the circuits shown in FIG. 2 can be easily assembled on an integrated circuit since the voltage range ratio between the first and second circuits 18A and 20A can be easily set by selecting the coefficient "k·m".

Figure 4:
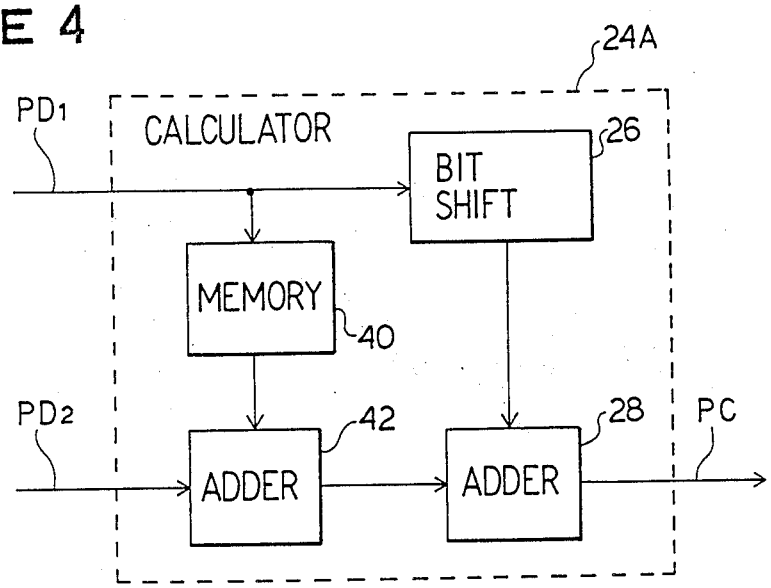
FIG. 4 is a block diagram showing another embodiment of the calculator provided in the A/D converter shown in FIG. 1.

Referring to FIG. 4, there is shown another embodiment 24A of the calculator used in the A/D converter. The shown calculator 24A includes a memory 40 and an adder 42 in addition to the bit shifter 26 and the adder 28 of the calculator 24 shown in FIG. 1. The memory 40 stores calibration data for the first digital signal $PD_1$ in order to compensate distortion in the output digital video signal PC caused by non-linearity of the A/D converting circuit 12 and the D/A converting circuit 34 and the other causes. Therefore, calibration digital data is read out from the memory 40 in accordance with the value of the first digital signal $PD_1$, and then, added to the second digital signal $PD_2$ in the adder 42. Thus, the calibrated second digital signal is inputted to the adder 28. In this modification, the memory 40 can be read out on the basis of the third digital signal PC.

Figure 5:
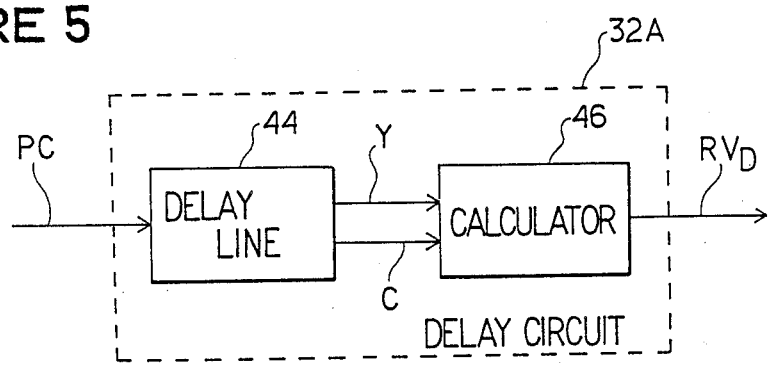
FIG. 5 is a block diagram showing another embodiment of the delay circuit provided in the A/D converter shown in FIG. 1.
Figure 6:
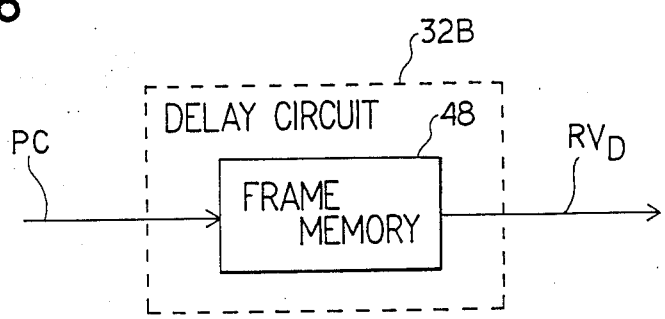
FIG. 6 is a block diagram showing a third embodiment of the delay circuit.

Referring to FIGS. 5 and 6, there are shown modifications of the delay circuit used in the bias voltage generator 30. As mentioned above, the bias voltage generator 30 is provided to supply the voltage at a sampling point adjacent to the input video signal PA. For this purpose, there is utilized the interline correlation of the analog video signal in the NTSC color television system. Particularly, such a fact is utilized that a pair of video signals for each pair of adjacent horizontal lines, including a chroma component, have substantially the same magnitude. But, the pair of video signals are separate from each other only in the scan direction, i.e., in time, and so, ordinary signal processing circuits can be used to obtain the voltage at a sampling point adjacent to the input video signal PA.

For example, as shown in FIG. 5, a delay circuit 32A includes a delay line 44 for giving a delay of one horizontal scan period and a calculator 44 connected to the delay line 44. The delay line 44 has a function of separating a luminance signal Y and a chroma signal C from the digital signal PC and outputting these signals delayed by the one horizontal scan period. The calculator 46 generates the digital bias signal $RV_D$ on the basis of the luminance signal Y and the chroma signal C.

As shown in FIG. 6, instead of the delay line, a frame memory 48 can be used so as to output the video signal before one frame but at the same picture element position as that of the video signal inputted to the input terminal 14. Furthermore, the circuits shown in FIGS. 5 and 6 can be combined.

The addition of the above mentioned circuits will increase a required chip area and therefore may not be recommendable to an integrated circuit. However, the above processings are often carried out in ordinary picture processings. Therefore, it is preferred to add the above circuits. In fact, since the above mentioned circuits can be realized with a slight modification of the system, the circuits can be added without a substantial increase of the chip area.

The above explained embodiment of the A/D coverter can output a digital video signal of 9 bits by using two 6-bit A/D converting circuits and one D/A converting circuit. The two 6-bit A/D converting circuits correspond in size to one 7-bit A/D converting circuit, and the one 6-bit D/A converting circuit can be fabricated at a size equal to or less than a half of one 6-bit D/A converting circuit. Therefore, the above mentioned embodiment of the A/D converter can be fabricated at a size one third or less of a conventional 9-bit A/D converter.

The above embodiment uses two 6-bit D/A converting circuits and the ratio of the reference voltage ranges supplied to the respective D/A converting circuits is 8:1. However, the bit number of the D/A converting circuits and the ratio of the respective reference voltage ranges can be to any values in accordance with the required quality of a picture. Generally considering, the following can be said: Assume that the first reference voltage source 10 generates $2^m$ (m is a positive integer) different reference voltage distributed in the voltage range $SV_1$ and the second reference voltage source 16 generates $2^n$ (n is a positive integer) different reference voltages distributed in the voltage range $SV_2$, where the ratio of $SV_1$ to $SV_2$ is $2^s$ (s is a positive integer). Also assume that the A/D converting circuits 12 and 22 generate digital signals of m bits and n bits, respectively, and the shift amount of the shifter 26 is "t" (t is a positive integer). Under these conditions, if such a relation is satisfied that m and n are larger than "t", respectively and $n+s-m$ is not greater than "t", the calculator 24 can generates an output digital signal of $(m+t)$ bits. Based on this general consideration, the above mentioned embodiment corresponds to the case $m=n=6$ and $s=t=3$.

As seen from the above description with reference to the accompanying drawings, the A/D converter in accordance with the present invention can have an increased resolution with small increase of circuits, i.e., small increase of chip area. Further, the A/D converter can output a digital signal of n bits without using $2^n$ comparators, i.e., at a low cost.

The invention has thus been shown and described with reference to the specific embodiments. However, it should be noted that the invention is in no way limited to the details of the illustrated structures but changes and modifications may be made within the scope of the appended claims.

I claim:

1. An A/D converter comprising a first reference voltage source generating a first group of reference voltages distributed in a first voltage range, a first A/D converting circuit connected to receive an analog signal and the first group of reference voltages for generating a first digital signal, a second reference voltage source having a bias input receiving a bias voltage and generating a second group of reference voltages which are distributed in a second voltage range smaller than the first voltage range and which are biased by a bias voltage inputted to the bias input, a second A/D converting circuit connected to receive the analog signal mentioned above and the second group of reference voltages for generating a second digital signal, a calculator receiving the first and second digital signals for generating a third digital signal having a resolution higher than that of the first digital signal, and a bias voltage generator receiving the third digital signal for generating an analog bias voltage to the bias input of the second reference voltage source.

2. An A/D converter claimed in claim 1 wherein the calculator includes a shifter receiving the first digital signal for outputting a digital signal shifted by a predetermined bit number, and an adder receiving the shifted digital signal and the second digital signal for generating the third digital signal having the bit number larger than that of the first digital signal by the above mentioned predetermined bit number.

3. An A/D converter claimed in claim 1 wherein the calculator includes a shifter receiving the first digital signal for outputting a digital signal shifted by a predetermined bit number a memory storing correction data for compensating conversion distortion and connected to receive the first digital signal so as to output a correction digital signal in accordance with the first digital signal, a first adder receiving the correction digital signal and the second digital signal for generating the corrected second digital signal, and a second adder receiving the shifted digital signal and the corrected second digital signal for generating the third digital signal having the bit number larger than that of the first digital signal by the above mentioned predetermined bit number.

4. An A/D converter claimed in claim 1 wherein the bias voltage generator includes a delay circuit receiving the third digital signal for generating a delayed third digital signal and a D/A converter receiving the delayed third digital signal for generating the analog bias voltage.

5. An A/D converter claimed in claim 4 wherein the delay circuit includes a delay line receiving the third digital signal for generating a delayed third digital signal and a rounding circuit receiving the delayed third digital signal for generating a rounded third digital signal to the D/A converting circuit.

6. An A/D converter claimed in claim 4 wherein the delay circuit includes a delay line receives the third digital signal for generating a delayed luminance signal and a delayed chroma signal, and a calculator receiving the delayed luminance signal and the delayed chroma signal for generating a modified third digital signal to the D/A converting circuit.

7. An A/D converter claimed in claim 4 wherein the delay circuit includes a frame memory receiving the third digital signal for generating a digital signal of a video information before one frame but at the same picture element position as that of the video signal inputted.

8. An A/D converter claimed in claim 1 wherein the second reference voltage source includes two fixed voltage sources having the same output voltage and series-connected in the same polarity to each other, and a plurality of series-connected resistors of the same resistance connected across the series-connected voltage sources so that all connection nodes of the series resistors generate the second group of different reference voltages, respectively, the connection node between the two fixed voltage sources being connected to receive the bias voltage.

9. An A/D converter claimed in claim 1 wherein the first reference voltage source includes a first constant current source supplying a first constant current and first series resistors of the same resistance connected in series to the first constant current source so that the respective connection nodes of the first resistors will generate that first group of different voltages distributed at equal voltage difference in the first voltage range, and the second reference voltage source includes a second constant current source suplying a second constant current smaller than the first constant current and second series resistors having the same resistance smaller than the first resistors and connected in series to the second constant current source so that the respective connection nodes of the second resistors will generate that second group of different voltages distributed at equal voltage difference in the second voltage range.

10. An A/D converter comprising a first reference voltage source generating a first group of $2^m$ (m is a positive integer) reference voltages distributed in a first voltage range, a first A/D converting circuit connected to receive an analog signal and the first group of reference voltages for generating a first digital signal of m bits, a second reference voltage source having a bias input receiving a bias voltage and generating a second group of $2^n$ (n is a positive integer) reference voltages which are distributed in a second voltage range which is $\frac{1}{2^s}$ (s is a positive integer) of the first voltage range and which are biased by the bias voltage inputted to the bias input, a second A/D converting circuit connected to receive the analog signal mentioned above and the second group of reference voltages for generating a second digital signal of n bits, a calculator receiving the first and second digital signals for generating a third digital signal of (m+t) bits (t is a positive integer not greater than m and n, respectively, and less than n+s−m), and a bias voltage generator receiving the third digital signal for generating an analog bias voltage to the bias input of the second reference voltage source.

11. An A/D converter claimed in claim 10 wherein the calculator includes a shifter receiving the first digital signal of m bits for outputting a digital signal of (m+t) bits obtained by upwardly shifting the first digital signal by t bits, and an adder receiving the shifted digital signal and the second digital signal for generating the third digital signal of (m+t) bits.

12. An A/D converter claimed in claim 10 wherein the calculator includes a shifter receiving the first digital signal of m bits for outputting a digital signal of (m+t) bits obtained by upwardly shifting the first digital signal by t bits, a memory storing correction data for compensating conversion distortion and connected to receive the first digital signal so as to output a correction digital signal in accordance with the first digital signal, a first adder receiving the correction digital signal and the second digital signal for generating the corrected second digital signal, and a second adder receiving the shifted digital signal and the corrected second digital signal for generating the third digital signal of (m+t) bits.

13. An A/D converter claimed in claim 10 wherein the second reference voltage source includes two fixed voltage sources having the same output voltage as a half of the second voltage range and series-connected in the same polarity to each other, and $(2^n-1)$ series-connected resistors of the same resistance connected across the series-connected voltage sources so that all connection nodes of the series resistors generate the second group of different reference voltages, respectively, the connection node between the two fixed voltage sources being connected to receive the bias voltage.

14. An A/D converter claimed in claim 10 wherein the first reference voltage source includes a first constant current source supplying a first constant current and first series resistors of the same resistance connected in series to the first constant current source so that the respective connection nodes of the first resistors will generate that first group of different voltages distributed at equal voltage difference in the first voltage range, and the second reference voltage source includes a second constant current source supplying a second constant current smaller than the first constant current and second series resistors having the same resistance smaller than the first resistors and connected in series to the second constant current source so that the respective connection nodes of the second resistors will generate that second group of different voltages distributed at equal voltage difference in the second voltage range.

15. An A/D converter for use in a video signal digital processing apparatus, comprising a first reference voltage source generating a first group of reference voltages distributed in a first voltage range, a first A/D converting circuit connected to receive an analog video signal and the first group of reference voltages for generating a first digital signal, a second reference voltage source having a bias input receiving a bias voltage and generating a second group of reference voltages which are distributed in a second voltage range smaller than the first voltage range and which are biased by a bias voltage inputted to the bias input, a second A/D converting circuit connected to receive the analog video signal mentioned above and the second group of reference voltages for generating a second digital signal, a calculator receiving the first and second digital signals for generating a digital video signal having a resolution higher than that of the first digital signal, and a bias voltage generator receiving the digital video signal for generating an analog bias voltage to the bias input of the second reference voltage source.

16. An A/D converter claimed in claim 15 wherein the calculator includes a shifter receiving the first digital signal for outputting a digital signal shifted by a predetermined bit number, a memory storing correction data for compensating conversion distortion and connected to receive the first digital signal so as to output a correction digital signal in accordance with the first digital signal, a first adder receiving the correction digital signal and the second digital signal for generating the corrected second digital signal, and a second adder receiving the shifted digital signal and the corrected second digital signal for generating and the digital video signal having the bit number larger than that of the first digital signal by the above mentioned predetermined bit number.

17. An A/D converter claimed in claim 15 wherein the bias voltage generator includes a delay circuit receiving the digital video signal for generating a delayed digital video signal delayed by at least one horizontal scan period and a D/A converter receiving the delayed digital video signal for generating the analog bias voltage.

18. An A/D converter claimed in claim 17 wherein the delay circuit includes a delay line receiving the digital video signal for generating a delayed digital video signal delayed by at least one horizontal scan period, and a rounding circuit receiving the delayed digital video signal for generating a rounded delayed digital video signal to the D/A converting circuit.

19. An A/D converter claimed in claim 17 wherein the delay circuit includes a delay line receiving the digital video signal for generating a delayed luminance signal and a delayed chroma signal which are delayed by at least one horizontal scan period, and a calculator receiving the delayed luminance signal and the delayed chroma signal for generating a modified delayed digital video signal to the D/A converting circuit.

20. An A/D converter claimed in claim 17 wherein the delay circuit includes a frame memory receiving the digital video signal for generating a digital signal of a video information before one frame but at the same picture element position as that of the video signal inputted.

* * * * *

UNITED STATES PATENT AND TRADEMARK OFFICE
CERTIFICATE OF CORRECTION

PATENT NO. : 4,768,015
DATED : August 30, 1988
INVENTOR(S) : Amano

It is certified that error appears in the above-identified patent and that said Letters Patent is hereby corrected as shown below:

COLUMN 3, LINE 32   After "delay" (first instance) insert --circuit--.

Signed and Sealed this

Sixteenth Day of May, 1989

Attest:

Attesting Officer

DONALD J. QUIGG

Commissioner of Patents and Trademarks